(12) United States Patent
Shiota et al.

(10) Patent No.: US 6,893,987 B2
(45) Date of Patent: May 17, 2005

(54) SIMPLE PROCESS FOR FABRICATING SEMICONDUCTOR DEVICES

(75) Inventors: Kunihiro Shiota, Tokyo (JP); Fujio Okumura, Tokyo (JP)

(73) Assignee: NEC Corporation (JP)

( * ) Notice: Subject to any disclaimer, the term of this patent is extended or adjusted under 35 U.S.C. 154(b) by 0 days.

(21) Appl. No.: 10/431,192

(22) Filed: May 7, 2003

(65) Prior Publication Data

US 2003/0215987 A1 Nov. 20, 2003

(30) Foreign Application Priority Data

May 15, 2002 (JP) .......................... 2002-140647

(51) Int. Cl.$^7$ .................. H01L 21/76; H01L 21/301; H01L 21/22
(52) U.S. Cl. .................... 438/942; 438/401; 438/462; 438/552; 438/942
(58) Field of Search ................. 438/149, 151, 438/364, 401, 462, 552, 725, 942, 982

(56) References Cited

U.S. PATENT DOCUMENTS

| | | | | | |
|---|---|---|---|---|---|
| 4,504,148 A | * | 3/1985 | Kuroki et al. | ............... | 356/401 |
| 4,900,396 A | * | 2/1990 | Hayashi et al. | ............. | 438/705 |
| 4,958,160 A | * | 9/1990 | Ito et al. | ................ | 355/53 |
| 5,369,050 A | * | 11/1994 | Kawai | .................... | 438/401 |
| 5,534,969 A | * | 7/1996 | Miyake | ................. | 355/53 |
| 5,682,228 A | * | 10/1997 | Miyake | ................. | 355/75 |
| 5,741,732 A | * | 4/1998 | Tikhonov | ............... | 438/149 |
| 5,969,428 A | * | 10/1999 | Nomura et al. | ............. | 257/797 |
| 5,978,094 A | * | 11/1999 | Narabe et al. | .............. | 356/401 |
| 5,981,116 A | * | 11/1999 | Ota | ........................ | 430/22 |
| 5,986,765 A | * | 11/1999 | Nakasuji | ................. | 356/399 |
| 6,071,656 A | * | 6/2000 | Lin | .......................... | 430/22 |
| 6,124,922 A | * | 9/2000 | Sentoku | ................. | 355/53 |
| 6,466,301 B1 | * | 10/2002 | Yui et al. | ................... | 355/53 |
| 6,628,391 B2 | * | 9/2003 | Hoover et al. | ............. | 356/400 |
| 6,677,107 B1 | * | 1/2004 | Hasegawa et al. | ......... | 430/311 |
| 6,686,107 B2 | * | 2/2004 | Matsumoto et al. | ......... | 430/22 |
| 2002/0119609 A1 | * | 8/2002 | Hatano et al. | ............. | 438/164 |
| 2002/0130425 A1 | * | 9/2002 | Koike et al. | ................ | 257/797 |
| 2003/0202181 A1 | * | 10/2003 | Maltabes et al. | ........... | 356/401 |

* cited by examiner

Primary Examiner—John F. Niebling
Assistant Examiner—Stanetta Isaac
(74) Attorney, Agent, or Firm—Hayes Soloway P.C.

(57) ABSTRACT

An alignment pattern is required for photo masks to be exactly aligned with one another; an amorphous silicon is deposited over the entire surface of an insulating layer except for an area where the alignment pattern is to be formed, and a pattern for an ion-implantation and the alignment pattern are concurrently transferred to a photo resist layer; dopant impurity is ion implanted into the amorphous silicon layer by using the photo resist mask, and the insulating layer is selectively etched also by using the photo resist mask; this results in simplification of the process sequence.

20 Claims, 9 Drawing Sheets

SIMPLE PROCESS FOR FABRICATING SEMICONDUCTOR DEVICES

FIELD OF THE INVENTION

This invention relates to a fabrication of semiconductor device and, more particularly, to a process for fabricating semiconductor devices.

DESCRIPTION OF THE RELATED ART

One of the technical goals of the process for fabricating semiconductor devices is to make the characteristics of the circuit components such as thin film transistors uniform. From this point of view, patterns to be transferred onto the substrate are well aligned with one another.

FIGS. 1A to 1G and FIGS. 2A to 2G show a prior art process for fabricating thin film transistors. FIGS. 2A to 2G are respectively corresponding to FIGS. 1A to 1G, and shows cross sections of the intermediate structures respectively shown in FIGS. 1A to 1G. First, the prior art process is described with reference to FIGS. 1A to 1G and FIGS. 2A to 2G.

Figures 1A, 2A:
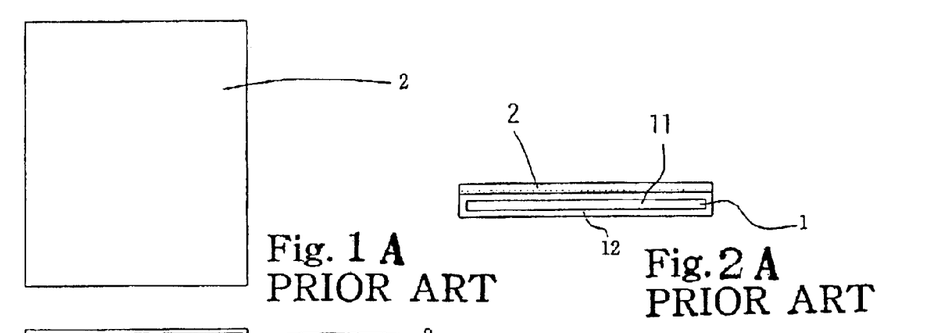
FIGS. 1A to 1G are plane views showing the sequence of the prior art process for fabricating thin film transistors.
FIGS. 2A to 2G are schematic cross sectional views showing the sequence of the prior art process respectively corresponding to FIGS. 1A to 1G, FIGS. 3A to 3O are schematic cross sectional views showing a process for fabricating thin film transistors according to the present invention.

The process starts with preparation of a glass substrate 1. A quartz substrate may be used in the prior art process. The glass substrate 1 has been already covered with an insulating layer of silicon dioxide, i.e., $SiO_2$, silicon nitride, i.e., SiN or silicon oxynitride, i.e., SiON. Amorphous silicon is deposited over the entire major surface of the glass substrate 1 through a chemical vapor deposition, and forms an amorphous silicon layer 2 as shown in FIGS. 1A and 2A.

Figures 1B, 2B:
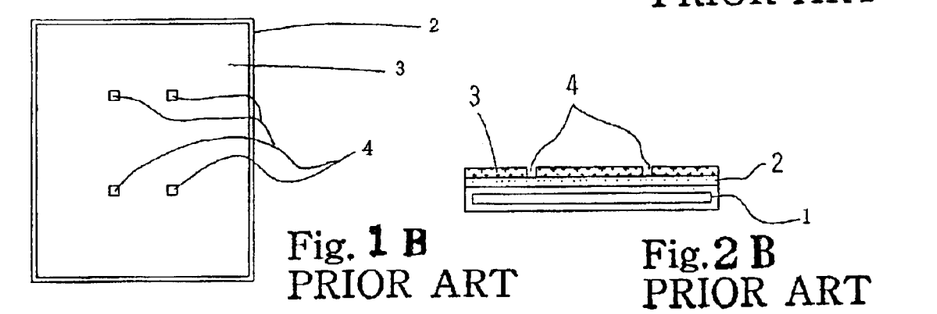

Subsequently, photo-sensitive resist is spread over the entire upper surface of the amorphous silicon layer 2 so that the amorphous silicon layer 2 is overlaid with a photo-sensitive resist layer. The photo-sensitive resist layer is exposed to image-carrying light so that a latent image of alignment marks 4 is produced in the photo-sensitive resist layer. The latent image is developed so that a photo-resist etching mask 3 is formed on the amorphous silicon layer 2, and alignment marks 4 are formed in the photo-resist etching mask 3 as shown in FIGS. 1B and 2B.

Figures 1C, 2C:
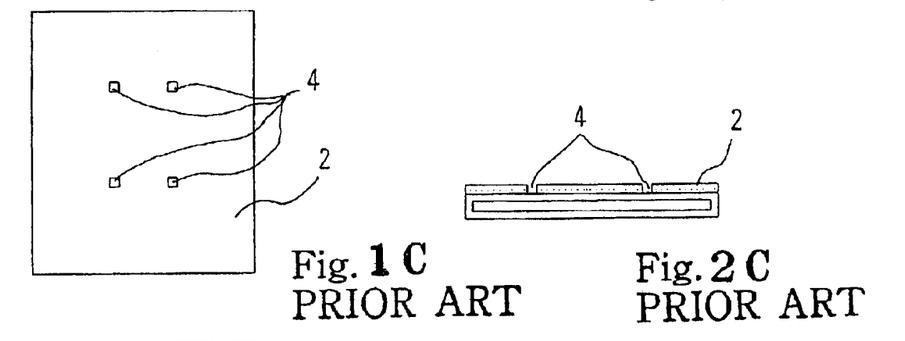

Subsequently, the amorphous silicon layer 2 is selectively etched by using the photo-resist etching mask 3, and, thereafter, the photo-resist etching mask 3 is stripped off. Thus, the alignment marks 4 are transferred from the photo-resist etching mask 3 to the amorphous silicon layer 2. The resultant structure is shown in FIGS. 1C and 2C.

Figures 1D, 2D:
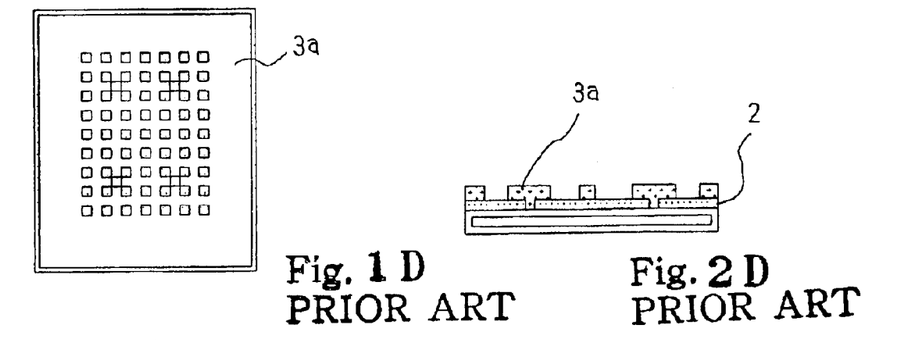

Photo-sensitive resist is spread over the resultant structure, and forms a photo-sensitive resist layer. Using the alignment marks 4, a photo mask (not shown) is aligned with the resultant structure, and the photo-sensitive resist layer is exposed to image-carrying light so that a latent image of active regions and new alignment marks is produced in the photo-sensitive resist layer. The active regions are assigned to channel regions and source/drain regions of thin film transistors. The latent image is developed so that a photo-resist ion-implantation mask 3a is formed on the amorphous silicon layer 2 as shown in FIGS. 1D and 2D.

Figure 1E:
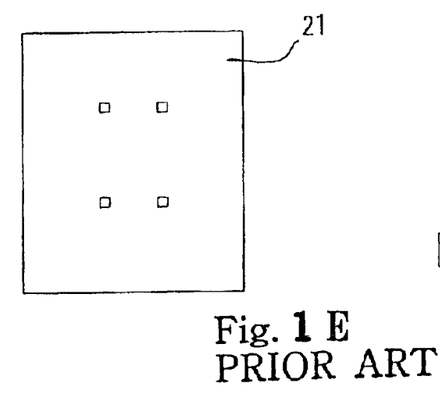
Figure 2E:
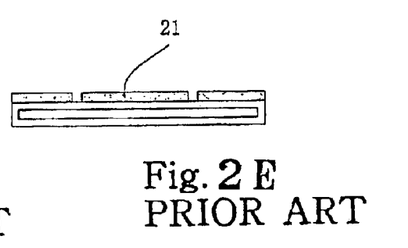

Using the photo-resist ion-implantation mask 3a, dopant impurities are ion implanted into the channel regions and the source/drain regions, and, thereafter, the photo-resist ion-implantation mask 3a is stripped off. The amorphous silicon layer 2 is crystallized through a solid phase growth or an eximer laser annealing. Thus, the amorphous silicon layer 2 is converted to a polysilicon layer 21 as shown in FIGS. 1E and 2E.

Figure 1F:
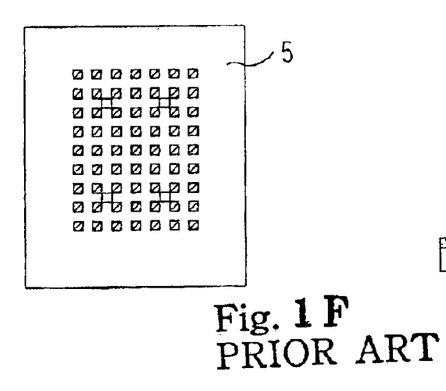
Figure 2F:
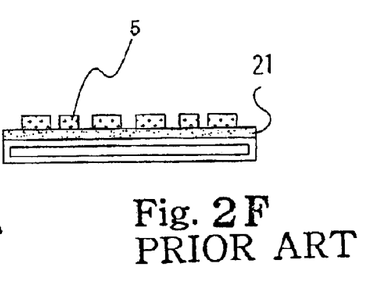

Photo-sensitive resist is spread over the resultant structure, and forms a photo-sensitive resist layer. Using the alignment marks 4, again, a photo mask (not shown) is aligned with the resultant structure, and the photo-sensitive resist layer is exposed to image-carrying light so that a latent image of islands is produced in the photo-sensitive resist layer. The latent image is developed so that a photo-resist etching mask 5 is left on the polysilicon layer 21 as shown in FIGS. 1F and 2F.

Figure 1G:
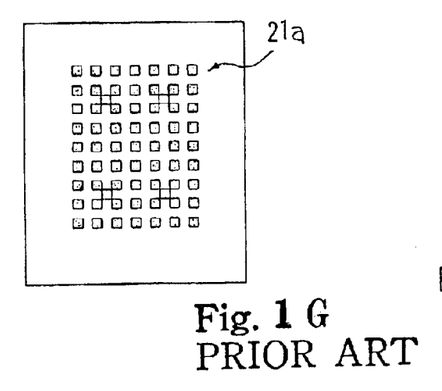
Figure 2G:
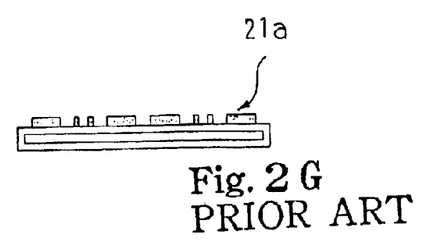

Using the photo-resist etching mask 5, the polysilicon 21 is selectively etched so that the polysilicon 21 is patterned into islands 21a as shown in FIGS. 1G and 2G. The islands 21a offer the channel regions and source/drain regions to thin film transistors. The photo-resist etching mask 5 is stripped off, and the prior art process proceeds to the next stage.

A problem with the prior art process is the complicated sequence and, accordingly, high production cost. This is because photo-lithography and etching are required for the pattern transfer of the alignment marks 4 (see FIGS. 1B/2B and 1C/2C) before the formation of the photo resist ion-implantation mask 3a. As a result, the production cost is increased. If the alignment marks 4 are not formed, the photo masks are liable to be misaligned, and the thin film transistors fluctuate in device characteristics.

SUMMARY OF THE INVENTION

It is therefore an important object of the present invention to provide a process for fabricating semiconductor devices which is simple and economical without the fluctuation in device characteristics.

To accomplish the object, the present invention proposes to share a single patterned photo-resist layer between an etching for alignment marks and an ion-implantation.

In accordance with an aspect of the present invention, there is provided a process for fabricating a semiconductor device comprising the steps of a) preparing a substrate structure, b) forming a photo resist mask having a major pattern and an alignment pattern on the substrate structure, c) carrying out a pattern transfer from the photo resist mask to the substrate structure so as to form one of the major pattern and the alignment pattern in the substrate structure, d) carrying out another pattern transfer from the photo resist mask to the substrate structure so as to form the other of the major pattern and the alignment pattern in the substrate structure, and e) completing the semiconductor device through at least one photo-lithography.

BRIEF DESCRIPTION OF THE DRAWINGS

The features and advantages of the process will be more clearly understood from the following description taken in conjunction with the accompanying drawings, in which FIG. 14 is a schematic cross sectional view taken along line III-III' of FIG. 13C and showing a substrate selectively covered with amorphous silicon.

DESCRIPTION OF THE PREFERRED EMBODIMENTS

A process according to the present invention proceeds as follows. First, insulating substance such as, for example, $SiO_2$, SiN or SiON is grown on a substrate made of insulating material such as, for example, glass or quartz.

Subsequently, the insulating layer is overlaid with a semiconductor layer such as, for example, a silicon layer. Certain areas on the insulating layer are prohibited from growth of silicon. The certain areas may be covered with another layer. An alignment pattern is to be formed in the certain areas. The silicon is grown by using a chemical vapor deposition. This results in that the insulating layer is exposed to the hollow spaces defined in the silicon layer.

Subsequently, the silicon layer is overlaid with a photo resist layer, and the first pattern transfer is carried out through an exposure to image-carrying light for the alignment pattern and a major pattern to be transferred to the silicon layer in the next step or steps. The image-carrying light is produced by making light to pass through a photo mask. The major pattern may define an area into which dopant impurity is introduced. Otherwise, the major pattern may define an area to be etched. The photo resist layer is formed into a photo resist mask. The hollow spaces are uncovered with the photo resist mask, and the insulating layer is still exposed to the spaces defined in the photo resist mask.

First, the exposed parts of the insulating layer such as $SiO_2$ are etched away. While the insulating material is being etched, the silicon is resistive against the etchant, and the silicon layer is scarcely etched away. A wet etching may be used. As a result, the alignment pattern is formed in the insulating layer.

Using the photo resist mask, the silicon layer is treated. Dopant impurity may be selectively ion implanted into the silicon layer or etched away. Thus, the alignment pattern and major pattern are transferred to the insulating layer and silicon layer through the single photo-lithography.

The photo resist mask is stripped off, and the process proceeds. The alignment pattern is used in the next photo-lithography. For example, the silicon layer is crystallized through a solid-state growth or an eximer laser annealing, and another photo resist mask is patterned on the silicon layer through the photo-lithography. Another photo mask is used in the photo-lithography. The alignment pattern is used for the alignment between the photo mask and the previous photo mask. Using the photo resist mask, the silicon layer is selectively etched away so that the silicon layer is patterned into islands on the insulating layer.

As will be understood from the foregoing description, the alignment pattern and major pattern is transferred through the single photo-lithography to the two layers. This results in that the process is simplified.

First Embodiment

Figures 3A, 3B:
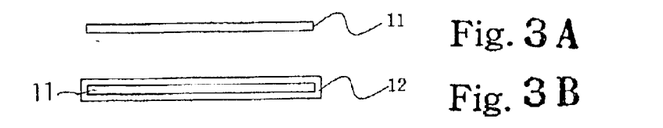
Figure 3C:
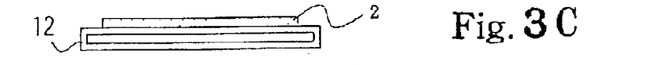
Figure 3D:
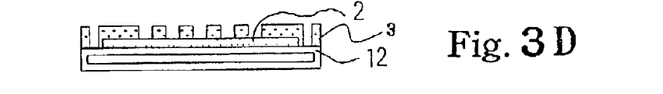
Figure 3E:
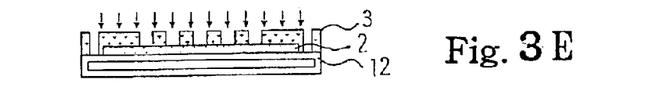
Figure 3F:
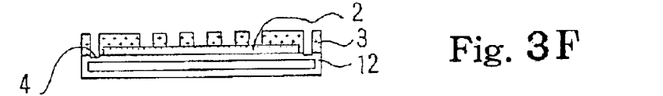
Figure 3G:
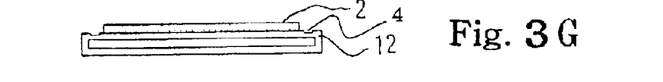
Figure 3H:
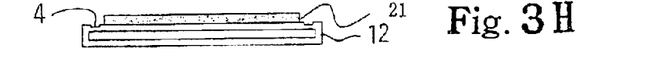
Figure 3I:
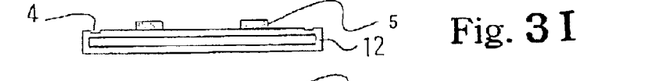
Figure 3J:
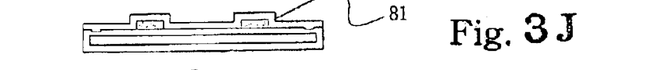
Figure 3K:
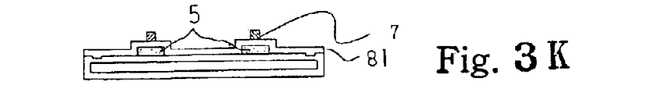
Figure 3L:
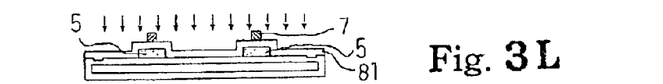
Figure 3M:
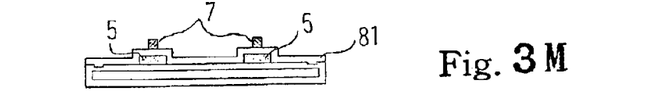
Figure 3N:
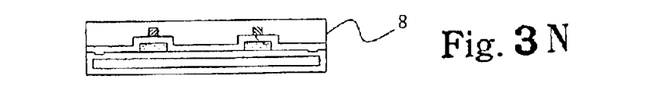
Figure 3O:
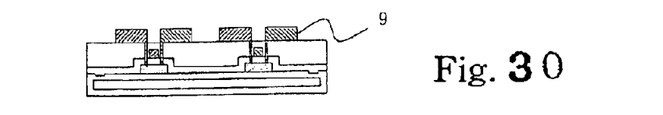

FIGS. 3A to 3O show a process for fabricating thin film transistors in accordance with the present invention. The process starts with preparation of a glass substrate 11 as shown in FIG. 3A. Insulating oxide is deposited over the entire surface of the glass substrate 11, and forms an oxide layer 12 as shown in FIG. 3B. The oxide layer 12 prevents another layer to be formed thereon from contaminants on or in the glass substrate 1, and is 1000 angstroms to 5000 angstroms thick.

Figure 4A:
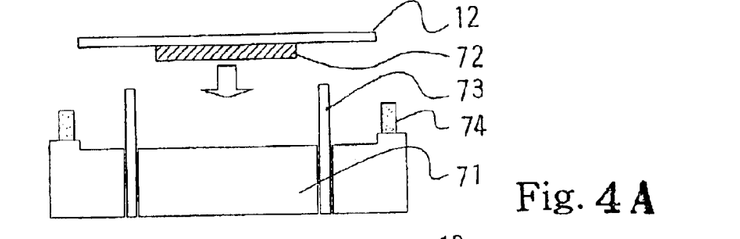
FIGS. 4A to 4F are schematic cross sectional views showing a sub-process for depositing amorphous silicon in a central area on a substrate.
Figure 4B:
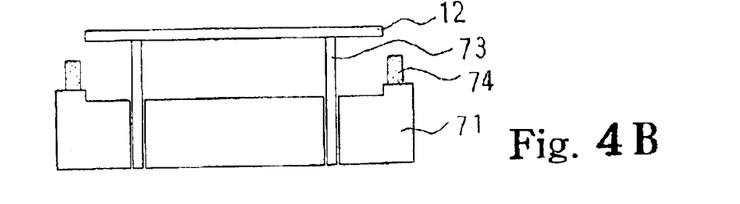
Figure 4C:
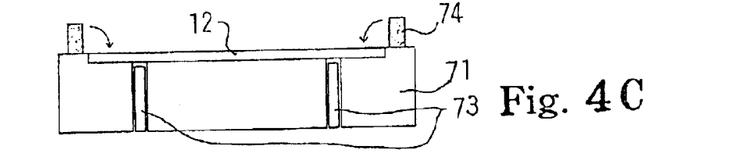
Figure 4D:
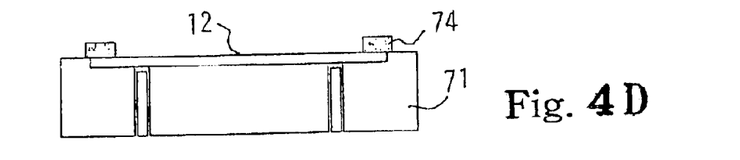
Figure 4E:
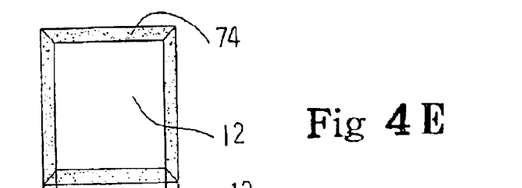
Figure 4F:
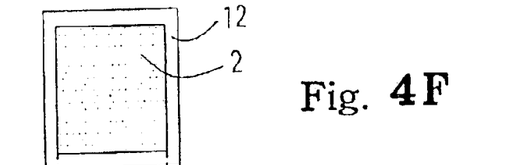
Figure 5:
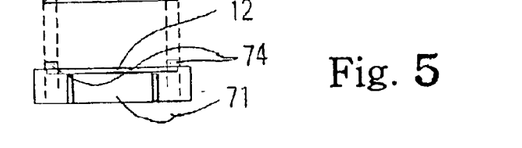
FIG. 5 is a schematic cross sectional view showing the structure of a resultant structure shown in FIG. 4E.
Figure 6:
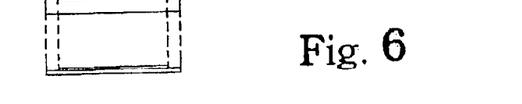
FIG. 6 is a schematic cross sectional view showing the structure of a resultant structure shown in FIG. 4F, FIGS. 7A to 7N are schematic cross sectional views showing another process for fabricating thin film transistors according to the present invention.

Subsequently, amorphous silicon is grown on the oxide layer 12 by using a PECVD or a plasma enhanced chemical vapor deposition. However, the amorphous silicon is not deposited in a peripheral area of the major surface. The peripheral area is prohibited from the amorphous silicon as shown in FIGS. 4A to 4F, 5 and 6. In detail, the resultant structure shown in FIG. 3B is conveyed to a jig 71 by means of a robotic hand 72. Receiving pins 73 project from the jig 71, and a frame 74 stands on the jig 71 as shown in FIG. 4A. The robotic hand 72 is moved downwardly, and the resultant structure is put on the receiving pins 73 as shown in FIG. 4B. The receiving pins 73 are retracted into the jig 71, and the resultant structure is mounted on the jig 71 as shown in FIG. 4C. The frame 74 falls onto the resultant structure so that the peripheral area is covered with the frame 74 as shown in FIG. 4D. The resultant structure thus mounted on the jig 71 is inserted into the reactor of the chemical vapor deposition system as shown in FIGS. 4E and 5. The amorphous silicon is deposited over the entire surface. However, the amorphous silicon is never deposited on the peripheral area of the resultant structure. For this reason, when the resultant structure is separated from the jig 71, the peripheral area is uncovered with the amorphous silicon as shown in FIGS. 4F and 6.

Turning back to FIG. 3C, the amorphous silicon layer 2 is deposited on the central area on the upper surface of the oxide layer 12, and the oxide layer 12 is exposed to the space around the amorphous silicon layer 2. The amorphous silicon layer 2 will be formed into active regions of the thin film transistors, and the amount of leakage current is to be as small as possible. From this point of view, it is preferable that the amorphous silicon layer 2 is as thin as possible. In this instance, a process margin for the crystallization is taken into account, and the amorphous silicon layer 2 is 300 angstroms to 3000 angstroms thick.

Photo-sensitive resist is spread over the entire surface of the resultant structure, and forms a photo-sensitive resist layer. The entire surface of the amorphous silicon layer 2 and the peripheral surface of the oxide layer 12 are covered with the photo-sensitive resist layer. The photo-sensitive resist layer is exposed to image-carrying light, which has passed through a photo mask (not shown), and a latent image for an alignment pattern and a major pattern for an ion-implantation mask is produced in the photo-sensitive resist layer. The latent image is developed so that the photo-sensitive resist layer is patterned into a photo-resist mask 3 as shown in FIG. 3D. The alignment pattern is located on the peripheral surface of the oxide layer 12, and the major pattern for the ion-implantation is located on the amorphous silicon layer 2. Thus, the alignment pattern and the major pattern are concurrently transferred from the photo mask (not shown) to the photo-sensitive resist layer.

Subsequently, dopant impurity is selectively ion implanted into the amorphous silicon layer 2 by using the photo resist mask 3 as shown in FIG. 3E. The dopant impurity is introduced into the regions exposed to the hollow spaces of the photo-resist mask 3 and the regions of the oxide layer 12. However, the thin film transistors are fabricated on the central area, and the dopant impurity in the oxide layer 12 does not have any influence on the thin film transistors. The regions doped with the dopant impurity are corresponding to channel regions of islands 5 to be patterned at a later step.

Subsequently, the oxide layer is selectively etched away for forming the alignment pattern. In this instance, hydrofluoric acid or buffered hydrofluoric acid is used as the etchant. Since the amorphous silicon is resistive against the hydrofluoric acid, only the oxide, which is exposed to the etchant, is removed from the structure, and the alignment pattern 4 is formed in the oxide layer 12 as shown in FIG. 3F.

The photo resist mask 3 is stripped off, and the alignment pattern 4 is formed in the peripheral portion of the oxide layer 12 around the amorphous silicon layer 2 as shown in FIG. 3G. Thus, the ion-implantation and the etching for the alignment pattern 4 are carried out by using only one photo resist mask 3. This results in that the process sequence is simplified.

Subsequently, the amorphous silicon is crystallized by using an eximer laser annealing or a solid-state growth. Upon completion of the crystallization, the amorphous silicon layer 2 is converted to a polysilicon layer 21 as shown in FIG. 3H.

Subsequently, photo-sensitive resist is spread over the entire surface of the resultant structure, and forms a photo-sensitive resist layer. The resultant structure is inserted into an aligner, and a photo mask (not shown) is aligned with the resultant structure by using the alignment pattern 4. The alignment pattern 4 occupies the peripheral surface of the oxide layer 12, and any alignment pattern is not formed in the central area. However, the photo mask is well aligned with the previous photo mask. The photo-sensitive resist layer is exposed to an image-carrying light, which has passed through the photo mask (not shown), and a latent image for islands is produced in the photo-sensitive resist layer. The latent image is developed. Then, the photo-sensitive resist layer is patterned into a photo resist etching mask (not shown). Using the photo resist etching mask, the polysilicon is selectively etched away, and islands 5, which are electrically isolated from one another, are left on the central area of the oxide layer 12 as shown in FIG. 3I.

Subsequently, insulating material such as, for example, silicon oxide or silicon nitride is deposited over the entire surface of the resultant structure so that a gate insulating layer 81 is formed over the resultant structure as shown in FIG. 3J.

Gate electrodes 7 are formed on the gate insulating layer 81 (see FIG. 3K), and dopant impurity is ion implanted into the islands 5 in a self-aligned manner with the gate electrodes 7 (see FIG. 3L). In other words, the dopant impurity is not introduced into the channel regions. In case where the thin film transistors are an n-channel type, phosphorous is ion implanted into the islands 5. On the other hand, in case where the thin film transistors are a p-channel type, boron is ion implanted into the islands 5.

The ion-implanted dopant impurity is activated through a thermal annealing such as, for example, RTA, i.e., rapid thermal annealing or ELA. Thus, source and drain regions are formed in the islands 5, and the resultant structure is shown in FIG. 3M.

Insulating material is deposited for forming an inter-layer insulating layer 8 (see FIG. 3N), and conductive strips 9 are patterned on the inter-layer insulating layer 8. The conductive strips 9 penetrate through the inter-layer insulating layer 8, and are selectively held in contact with the source and drain regions as shown in FIG. 3O.

As will be understood from the foregoing description, the certain areas uncovered with the silicon layer are formed by using the jig 71 equipped with the frame 74.

Second Embodiment

Figure 7A:
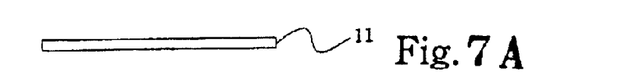
Figure 7B:
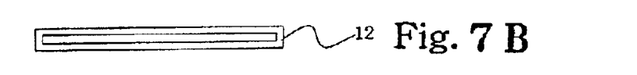
Figure 7C:
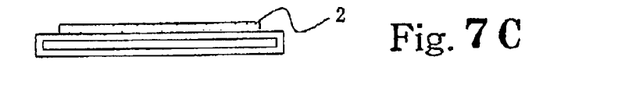
Figure 7D:
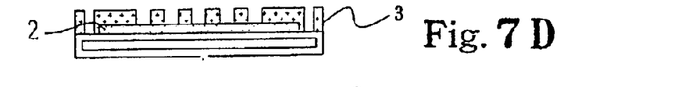

FIGS. 7A to 7N shows another process for fabricating thin film transistors according to the present invention. The process also starts with preparation of a substrate 11 of glass as shown in FIG. 7A, and an insulating layer 12 is grown on the entire surface of the substrate 11 (see FIG. 7B). An amorphous silicon layer 2 is deposited on the major surface of the insulating layer 12 except the peripheral area (see FIG. 7C), and a photo resist mask 3 is patterned on the upper surface of the resultant structure by using the photo-lithography. The photo resist mask 3 has a major pattern for the channel doping and an alignment pattern, and the major pattern and alignment pattern are in the central area and peripheral area, respectively, as shown in FIG. 7D. Those steps shown in FIGS. 7A to 7D are similar to the steps shown in FIGS. 3A to 3D.

Figure 7E:
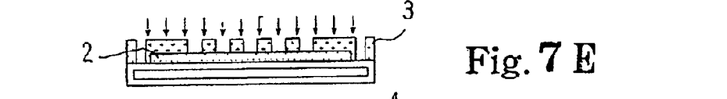
Figure 7F:
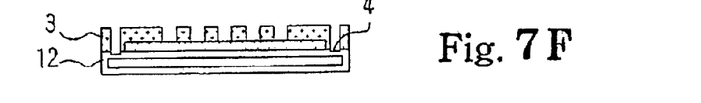
Figure 7G:
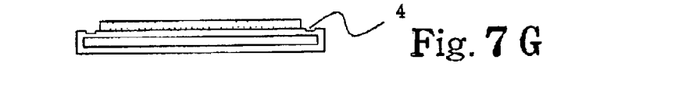

Subsequently, the dopant impurity is ion implanted into the amorphous silicon layer 2 (see FIG. 7E), and the alignment pattern is transferred from the photo resist mask 3 to the insulating layer 2 as shown in FIG. 7F. Thus, the photo resist mask 3 is shared between the ion-implantation for the channel regions and the etching for the alignment pattern. The photo resist mask 3 is stripped off (see FIG. 7G).

Figure 7H:
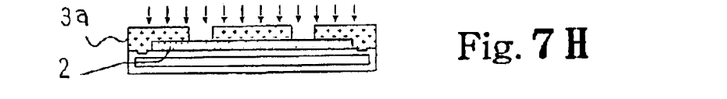

Thereafter, a photo resist ion-implantation mask 3*a* is patterned on the resultant structure by using the photo-lithography, and the dopant impurity is ion implanted into the amorphous silicon layer 2 for source/drain regions as shown in FIG. 7H. The alignment pattern 4 makes the photo masks aligned with each other. The photo resist mask 3*a* is stripped off.

Figure 7I:
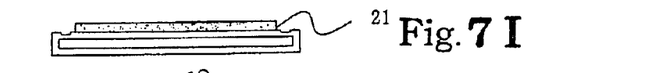
Figure 7J:
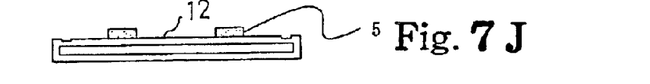
Figure 7K:
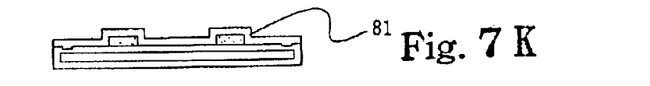
Figure 7L:
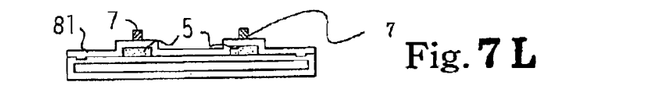

Subsequently, the amorphous silicon layer 2 is crystallized, and is converted to a polysilicon layer 21 (see FIG. 7I). Yet another photo resist mask (not shown) is patterned on the resultant structure, and the polysilicon 21 is patterned into islands 5 as shown in FIG. 7J. A gate insulating layer 81 is grown on the resultant structure, and the islands 5 are covered with the gate insulating layer 81 as shown in FIG. 7K. Gate electrodes 7 are patterned on the gate insulating layer 81, and pass over the islands 5 as shown in FIG. 7L.

Figure 7M:
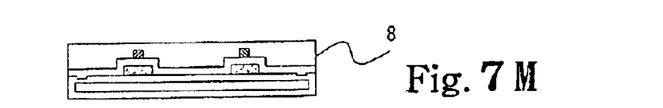
Figure 7N:
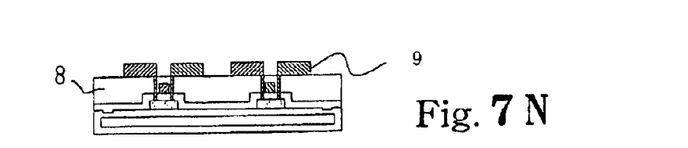

Subsequently, an inter-layered insulating layer 8 is deposited over the entire surface of the resultant structure (see FIG. 7M), and contact holes are formed in the inter-layered insulating layer 8. Conductive strips 9 are formed on the inter-layered insulating layer 8, and are selectively held in contact with the source/drain regions through the contact holes as shown in FIG. 7N.

The ion-implantation for the channel regions may be exchanged with the ion-implantation for the source/drain regions. In this instance, the photo resist mask 3 has a major pattern for the ion-implantation into the source/drain regions and the alignment pattern, and the ion-implantation for the source/drain regions is carried out by using the photo resist mask 3. The photo resist mask 3a has a pattern for the ion-implantation into the channel regions, and the dopant impurity is ion implanted into the amorphous silicon 2 by using the photo resist ion-implantation mask 3a. The other steps are similar to those of the process implementing the second embodiment.

In case where complementary field effect transistors form in combination an integrated circuit, the ion-implantation for the source and drain regions is repeated for the n-channel type field effect transistors and the p-channel type field effect transistors. Phosphorous and boron may be introduced into the source/drain regions in the islands assigned to the n-channel type field effect transistors and the source/drain regions in the islands assigned to the p-channel type field effect transistors, respectively.

In another process according to the present invention, the ion-implantation for the source/drain regions is repeated twice. The first ion-implantation is carried out before the crystallization of silicon (see FIG. 7H), and the second ion-implantation is carried out in the self-aligned manner between the patterning step (see FIG. 7L) and the deposition for the inter-layered insulating layer (see FIG. 7M). This process sequence is preferable for the complementary field effect transistors. If phosphorous is ion implanted into the source/drain regions of the n-channel type field effect transistors through the first ion-implantation, boron is ion implanted into the source/drain regions of the p-channel type field effect transistors through the second ion-implantation. Otherwise, when boron is ion implanted into the source/drain regions of the p-channel type field effect transistors through the first ion-implantation, phosphorous is ion implanted into the source/drain regions of the n-channel type field effect transistors through the second ion-implantation.

As will be understood, the single photo resist mask 3 is shared between the major pattern for the ion-implantation and the alignment pattern, and the process sequence is simpler than the prior art process sequence.

Third Embodiment

FIGS. 8A to 8G show essential steps of still another process embodying the present invention. The process sequence implementing the third embodiment is similar to that of the first embodiment until the crystallization of silicon. A difference from the process shown in FIGS. 3A to 3O is to form a second alignment pattern 41 concurrently with a major pattern for islands 5. Although the first alignment pattern is formed in the peripheral area, the second alignment pattern 41 is formed in the central area of the resultant structure so that photo masks are accurately aligned with one another. After the formation of the second alignment pattern 41, photo masks are aligned with one another with the assistance of the second alignment pattern 41.

Figure 8A:
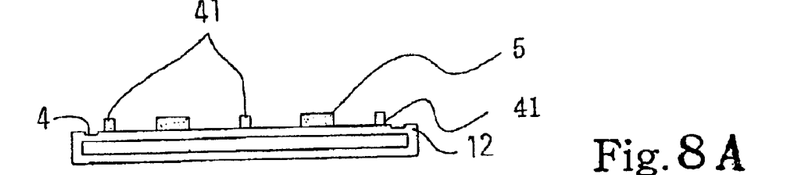
FIGS. 8A to 8G are schematic cross sectional views showing essential steps of yet another process for fabricating thin film transistors.

A photo resist mask (not shown) is patterned on the polysilicon layer 21 by using the photo-lithography. The photo resist mask has a major pattern for the islands 5 and the second alignment pattern 41, and the polysilicon layer 21 is selectively etched so that the major pattern and second alignment pattern 41 are transferred to the polysilicon layer. The photo resist mask is stripped off. Then, the islands 5 and second alignment pattern 41 are left on the insulating layer 12 as shown in FIG. 8A.

Figure 8B:
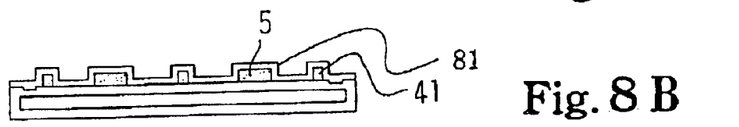
Figure 8C:
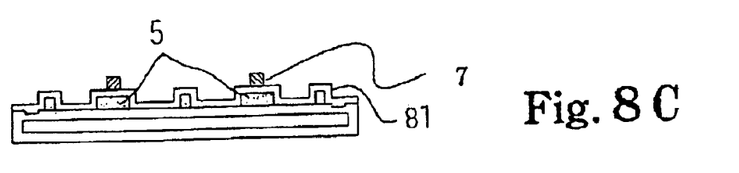
Figure 8D:
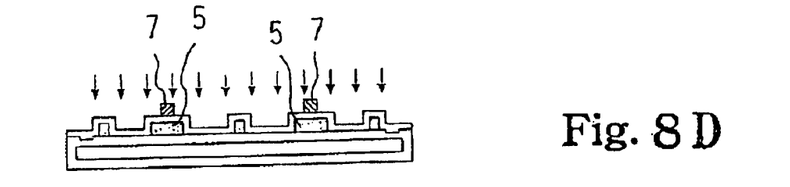
Figure 8E:
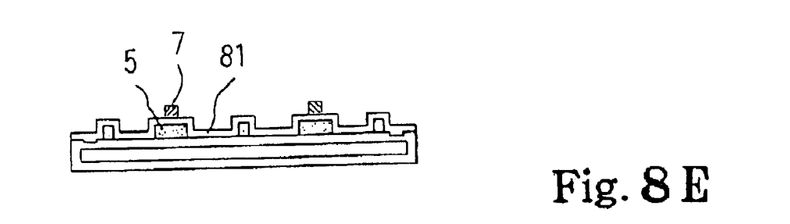
Figure 8F:
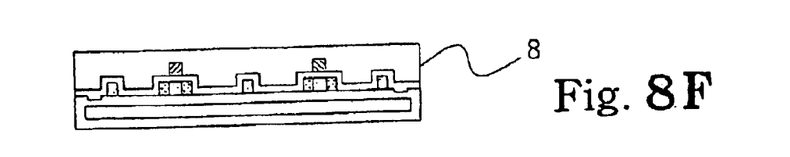

Subsequently, a gate insulating layer 81 is grown on the resultant structure, and the islands 5 and second alignment pattern 41 are covered with the gate insulating layer 81 as shown in FIG. 8B. Gate electrodes 7 are patterned on the gate insulating layer 81, and pass over the islands 5 as shown in FIG. 8C. Dopant impurity is ion implanted into the islands 5 (see FIG. 8D), and form source/drain regions of the thin film transistors as shown in FIG. 8E. The dopant impurity is activated.

Figure 8G:
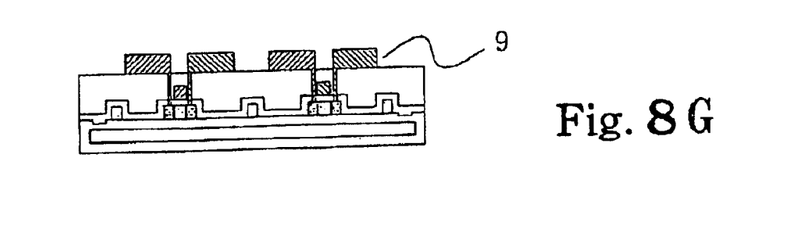

Subsequently, an inter-layered insulating layer 8 is deposited over the entire surface of the resultant structure (see FIG. 8F), and contact holes are formed in the inter-layered insulating layer 8. Conductive strips 9 are formed on the inter-layered insulating layer 8, and are selectively held in contact with the source/drain regions through the contact holes as shown in FIG. 8G. The conductive strips 9 and contact holes are patterned through the photo-lithography and etching, and two photo masks are required for the photo-lithography. Using the second alignment pattern 41, the photo masks are accurately aligned with one another.

As will be understood, more than one alignment pattern 4/41 are formed in the structure, and the alignment pattern 41 is formed in the central area together with the islands 8. Using those alignment patterns, the photo masks are accurately aligned with one another.

Fourth Embodiment

Yet another process embodying the present invention is different from the first embodiment in that the amorphous silicon is deposited by using a LPCVD (Low Pressure Chemical Vapor Deposition) instead of the PECVD, and uncovered areas for the alignment pattern 4 are defined during the LPCVD.

FIGS. 9A to 9D, 10, 11 and 12 show a preparatory work for the LPCVD and a resultant structure upon completion of the LPCVD. The process implementing the fourth embodiment is different from that of the first embodiment except for the deposition of the amorphous silicon so that description is hereinafter focused on the deposition of amorphous silicon.

Figure 9A:
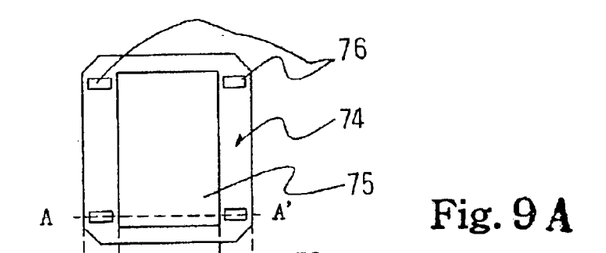
FIGS. 9A to 9D are plane views showing yet another process according to the present invention.

A buffer plate 74 has a frame-like shape, and a rectangular hollow space 75 is formed in the central area of the buffer plate 74 as shown in FIG. 9A. The buffer plate 74 is made of quartz. Pawls 76 are formed at the four corners of the buffer plate 74, and upwardly project from the buffer plate 74 (see FIG. 10). The buffer plate 74 retains the glass substrate 11 in the reactor chamber of the LPCVD system.

Figure 9B:
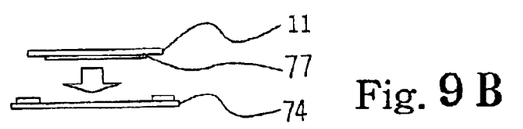

The glass substrate 11 is mounted on a robotic arm 77, and the robotic arm 77 conveys the glass substrate 11 to a space over the buffer plate 74. The glass substrate 11 is aligned with the buffer plate 74, and the robotic arm 77 is downwardly moved toward the buffer plate 74 as shown in FIG. 9B.

Figures 9C, 11:
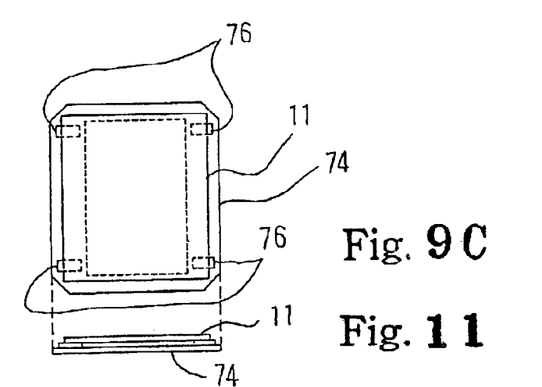
FIG. 11 is a side view showing the buffer plate assembled with a glass plate and corresponding to FIG. 9C.

The glass substrate 11 is placed on the pawls 76, and is spaced from the buffer plate 74 by means of the pawls 76 as shown in FIGS. 9C and 11. In other words, the glass substrate 11 is held in contact with the pawls 76, and other area of the glass substrate 11 is spaced from the buffer plate 74.

Figure 9D:
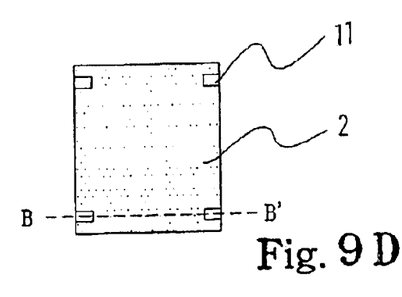
Figure 10:
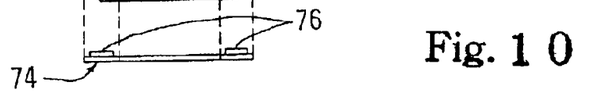
FIG. 10 is a schematic cross sectional view taken along line I-I' of FIG. 9A and showing the structure of a buffer plate.
Figure 12:
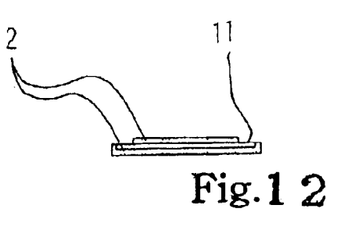
FIG. 12 is a schematic cross sectional view taken along line II-II' of FIG. 9D, FIGS. 13A to 13C are perspective views showing essential steps of still another process according to the present invention.

Amorphous silicon is deposited over the exposed area of the glass substrate 11, but is not grown on the areas held in contact with the pawls 76. As a result, the entire surface of the glass substrate 11 is covered with the amorphous silicon except the four areas at the corners of the glass substrate 11 as shown in FIGS. 9D and 12.

The photo resist mask 3 is patterned on the resultant structure as similar to the step shown in FIG. 3D, and is shared between the ion-implantation (see FIG. 3E) and the etching (see FIG. 3F). The remaining process sequence is similar to that of the process implementing the first embodiment, and no further description is incorporated hereinafter for the sake of simplicity. The insulating layer 12 may be grown before the deposition of amorphous silicon.

Fifth Embodiment

Still another process embodying the present invention is different from that of the first embodiment in that a shield plate 78 is used so as to define a peripheral area uncovered with the amorphous silicon. Other process sequence is similar to that shown in FIGS. 3A to 3O so that description is hereinafter focused on the step for depositing amorphous silicon with reference to FIGS. 13A to 13C and 14.

Figure 13A:
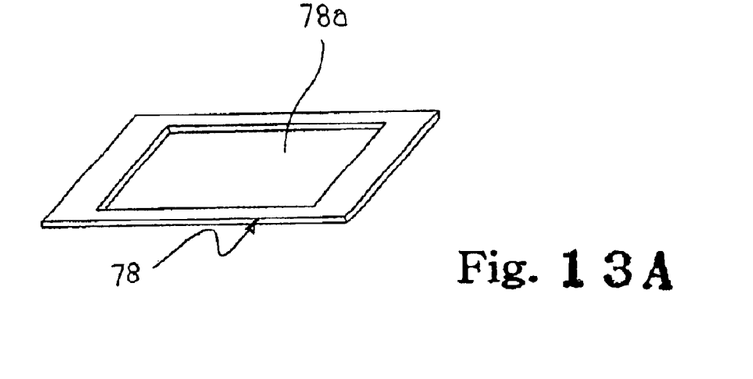
Figure 13B:
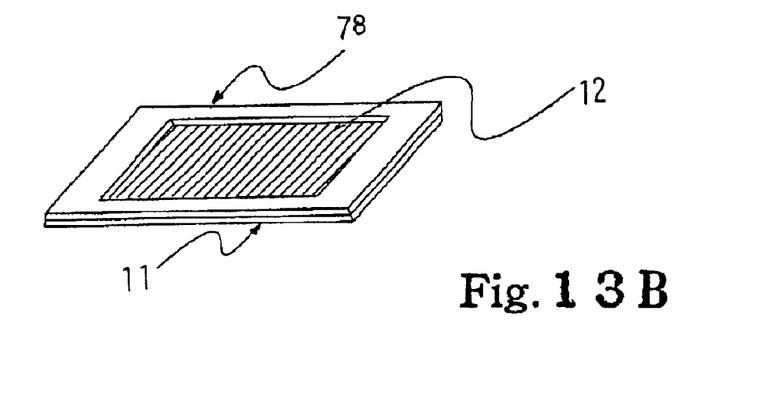

Upon completion of the deposition of insulating material on the substrate 11 (see FIG. 3B), the resultant structure is conveyed to a chemical vapor deposition system. A shield plate 78 is like a frame, and has a hollow space 78a (see FIG. 13A). The resultant structure is overlaid with the shield plate 78 so that the insulating layer 12 over the central area of the substrate 11 are exposed to the hollow space 78a as shown in FIG. 13B. The insulating layer 12 exposed to the hollow space is hatched so as to be discriminative from the shield plate 78.

Figures 13C, 14:
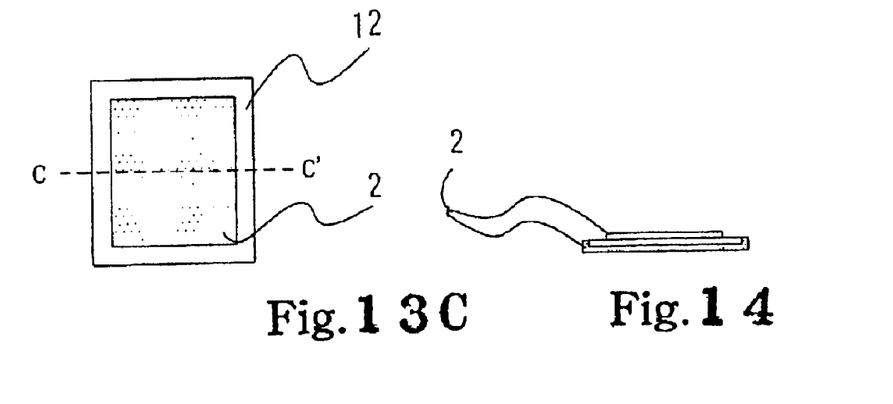

The resultant structure is placed in a reactor chamber of the chemical vapor deposition system, and amorphous silicon is deposited through the chemical vapor deposition. The shield plate 78 prevents the peripheral area of the insulating layer 12 from the amorphous silicon, and the amorphous silicon layer 2 are not grown on the peripheral area as shown in FIGS. 13C and 14.

The photo resist mask 3 is patterned on the resultant structure as similar to the step shown in FIG. 3D, and is shared between the ion-implantation (see FIG. 3E) and the etching (see FIG. 3F). The remaining process sequence is similar to that of the process implementing the first embodiment, and no further description is incorporated hereinafter for the sake of simplicity.

Sixth Embodiment

Figure 15A:
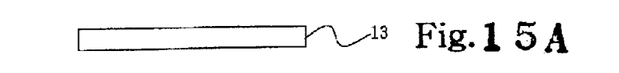
FIGS. 15A to 15N are schematic cross sectional views showing yet another process for fabricating semiconductor devices according to the present invention.
Figure 15B:
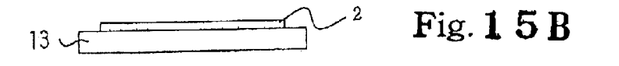
Figure 15C:
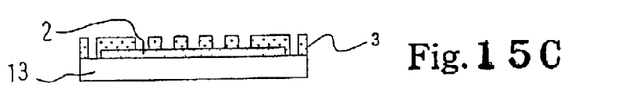
Figure 15D:
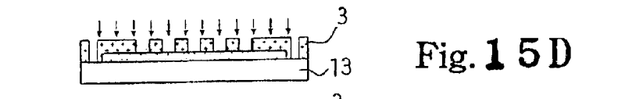
Figure 15E:
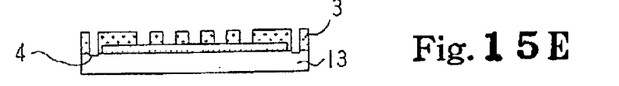
Figure 15F:
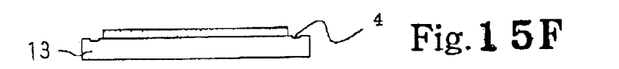
Figure 15G:
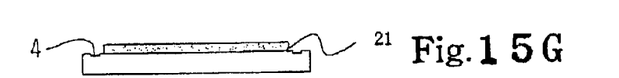
Figure 15H:
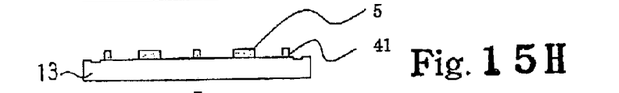
Figure 15I:
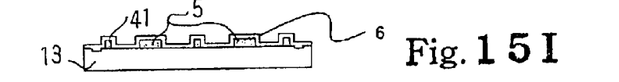
Figure 15J:
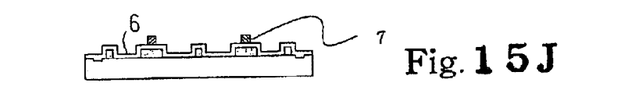
Figure 15K:
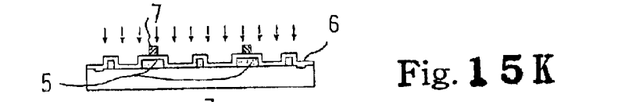
Figure 15L:
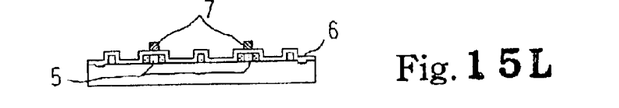
Figure 15M:
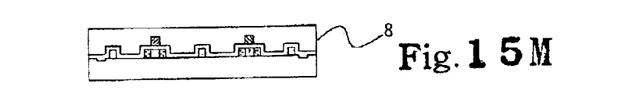
Figure 15N:
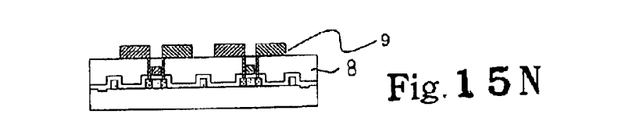

FIGS. 15A to 15N show yet another process embodying the present invention. The process starts with preparation of a quartz substrate 13. The quartz substrate 13 is advantageous over the glass substrate 11 in that an amorphous silicon layer is free from the contamination. For this reason, any insulating substrate is not deposited over the quartz substrate 13 before growth of amorphous silicon.

Subsequently, amorphous silicon is grown on the quartz substrate 13 by using the PECVD or the LPCVD. However, the amorphous silicon is not deposited in a peripheral area of the major surface. The peripheral area is prohibited from the amorphous silicon. The amorphous silicon layer 2 is deposited on the central area on the upper surface of the quartz substrate 13, and the quartz substrate 13 is exposed to the space around the amorphous silicon layer 2 as shown in FIG. 15B.

Photo-sensitive resist is spread over the entire surface of the resultant structure, and forms a photo-sensitive resist layer. The entire surface of the amorphous silicon layer 2 and the peripheral surface of the quartz substrate 13 are covered with the photo-sensitive resist layer. The photo-sensitive resist layer is exposed to image-carrying light, which has passed through a photo mask (not shown), and a latent image for a first alignment pattern 4 and a major pattern for an ion-implantation mask is produced in the photo-sensitive resist layer. The latent image is developed so that the photo-sensitive resist layer is patterned into a photo-resist mask 3 as shown in FIG. 15C. The alignment pattern is located on the peripheral surface of the quartz substrate 13, and the major pattern for the ion-implantation is located on the amorphous silicon layer 2. Thus, the alignment pattern and the major pattern are concurrently transferred from the photo mask (not shown) to the photo-sensitive resist layer.

Subsequently, dopant impurity is selectively ion implanted into the amorphous silicon layer 2 by using the photo resist mask 3 as shown in FIG. 15D. The dopant impurity is introduced into the regions exposed to the hollow spaces of the photo-resist mask 3 and the regions of the quartz substrate 13. However, the thin film transistors are fabricated on the central area, and the dopant impurity in the quartz substrate 13 does not have any influence on the thin film transistors.

Subsequently, the quartz substrate 13 is selectively etched away for forming the first alignment pattern 4 as shown in FIG. 15E. Since the amorphous silicon is resistive against the etchant, only the quartz substrate 13, which is exposed to the etchant, is removed from the structure, and the first alignment pattern 4 is formed in the oxide layer 12. The photo resist mask 3 is stripped off, and the first alignment pattern 4 is left in the peripheral area of the quartz substrate 13 as shown in FIG. 15F. Thus, the ion-implantation for the active regions and the etching for the first alignment pattern 4 are carried out by using only one photo resist mask 3.

Subsequently, the amorphous silicon is crystallized by using an eximer laser annealing or a solid-state growth. Upon completion of the crystallization, the amorphous silicon layer 2 is converted to a polysilicon layer 21 as shown in FIG. 15G.

Subsequently, photo-sensitive resist is spread over the entire surface of the resultant structure, and forms a photo-sensitive resist layer (not shown). The resultant structure is inserted into an aligner, and a photo mask (not shown) is aligned with the resultant structure by using the alignment pattern 4. The alignment pattern 4 occupies the peripheral surface of the oxide layer 12, and any alignment pattern is not formed in the central area. However, the photo mask is well aligned with the previous photo mask.

The photo-sensitive resist layer is exposed to an image-carrying light, which has passed through the photo mask (not shown), and a latent image for islands and a second alignment pattern 41 is produced in the photo-sensitive resist layer. The latent image is developed. Then, the photo-sensitive resist layer is patterned into a photo resist mask (not shown). The photo resist mask has the major pattern for the islands 5 and second alignment pattern 41 in the central area under the polysilicon layer 21. Using the photo resist mask, the polysilicon layer 21 is selectively etched away, and islands 5, which are electrically isolated from one another, and the second alignment pattern 41 are left on the central area of the quartz substrate 13 as shown in FIG. 15H.

Subsequently, insulating material such as, for example, silicon oxide or silicon nitride is deposited over the entire surface of the resultant structure so that a gate insulating layer 6 is formed over the resultant structure as shown in FIG. 15I.

Gate electrodes 7 are formed on the gate insulating layer 6 (see FIG. 15J), and dopant impurity is ion implanted into the islands 5 in a self-aligned manner with the gate electrodes 7 (see FIG. 15K). In other words, the dopant impurity is not introduced into the channel regions. In case where the thin film transistors are an n-channel type, phosphorous is, by way of example, ion implanted into the islands 5. On the other hand, in case where the thin film transistors are a p-channel type, boron is, by way of example, ion implanted into the islands 5.

The ion-implanted dopant impurity is activated through a thermal annealing such as, for example, RTA, i.e., rapid thermal annealing or ELA. Thus, source and drain regions are formed in the islands 5, and the resultant structure is shown in FIG. 15L.

Insulating material is deposited for forming an inter-layer insulating layer 8 (see FIG. 15M), and conductive strips 9 are patterned on the inter-layer insulating layer 8. The conductive strips 9 penetrate through contact holes formed in the inter-layer insulating layer 8, and are selectively held in contact with the source and drain regions as shown in FIG. 15N.

A photo resist mask is required for the conductive strips 9, and another photo resist mask is further required for the contact holes. The patterns are transferred from photo masks to the photo-sensitive resist layers by using the photo-lithography, and the alignment pattern 41 makes the photo masks well aligned with one another. For this reason, the thin film transistors exhibit target device characteristics.

As will be appreciated from the foregoing description, the alignment pattern and major pattern are transferred through the single photo-lithographic step. This results in the simple process sequence. The alignment pattern or patterns make the photo masks aligned with one another so that the target layers are strictly overlapped with one another. This results in that the devices uniformly exhibit the target device characteristics.

Although particular embodiments of the present invention have been shown and described, it will be apparent to those skilled in the art that various changes and modifications may be made without departing from the spirit and scope of the present invention.

The major pattern, which is transferred together with the alignment pattern, may be used for an etching on a layer different from the layer in which the alignment pattern is formed.

The present invention is applicable to another process for fabricating other semiconductor devices. In other words, the thin film transistors do not set any limit to the technical scope of the present invention.

The layers to which the major pattern and alignment pattern are to be formed may be conductive and insulating, respectively. In other words, any two of the conductive layer, semiconductor layer and insulating layer are available for the major pattern and alignment pattern. The major pattern and alignment pattern may be transferred to semiconductor layers made of different sorts of semiconductor. The semiconductor may be compound semiconductor or germanium.

The substrate may be made of semiconductor. In other words, the glass and quartz do not set any limit to the technical scope of the present invention.

In the first to fifth embodiments, the substrate 11, insulating layer 12 and amorphous silicon layer 2 as a whole constitute a substrate structure, and the quartz substrate 13 and amorphous silicon layer 2 as a whole constitute the substrate structure in the sixth embodiment. The substrate 11 and insulating layer 12 form in combination a preliminary structure, and the quartz substrate 13 serves as the preliminary structure. Amorphous silicon serves as amorphous silicon.

The alignment pattern 4 may be transferred to the insulating layer 12 before the ion-implantation into the amorphous silicon layer 2. The ion-implantation is a sort of pattern transfer, because the ion-implanted dopant impurity forms a pattern in the semiconductor layer 2.

In the first embodiment, the steps shown in FIGS. 3H to 3O as a whole constitute a step for completing a semiconductor device. In the other embodiments, the steps after the pattern transfers as a whole constitute the step for completing a semiconductor device.

Each of the glass substrate 11 and quartz substrate 13 serves as an insulating substrate.

The pattern for islands 5 and the second alignment pattern 41 serve as another major pattern and another alignment pattern, respectively.

What is claimed is:

1. A process for fabricating a semiconductor device, comprising the steps of:
   preparing a substrate structure,
   forming a photo resist mask having a major pattern and an alignment pattern on said substrate structure;
   carrying out a pattern transfer from said photo resist mask to said substrate structure so as to concurrently form one of said major pattern and said alignment pattern in said substrate structure;
   carrying out another pattern transfer from said photo resist mask to said substrate structure so as to concurrently form the other of said major pattern and said alignment pattern in said substrate structure; and
   completing said semiconductor device through at least one photo-lithography process.

2. The process as set forth in claim 1, in which said substrate structure includes a substrate, an insulating layer on a major surface of said substrate and a semiconductor layer formed on a part of said insulating layer.

3. The process as set forth in claim 2, in which said major pattern and said alignment pattern are transferred to said semiconductor layer and a remaining part of said insulating layer, respectively.

4. The process as set forth in claim 1, in which said pattern transfer and said another pattern transfer are carried out through an ion-implantation and an etching.

5. The process as set forth in claim 4, in which said major pattern is transferred from said photo resist mask to said substrate structure through said ion-implantation, and said alignment pattern is transferred from said photo resist mask to said substrate structure through said etching.

6. The process as set forth in claim 5, in which said major pattern is formed in a semiconductor layer formed on a part of an insulating layer, and said alignment pattern is formed in a remaining part of said insulating layer.

7. The process as set forth in claim 1, in which said substrate structure includes an insulating substrate and a semiconductor layer formed on a part of a major surface of said insulating substrate.

8. The process as set forth in claim 7, in which said major pattern is formed in said semiconductor layer, and said alignment pattern is formed in said remaining part of said insulating substrate.

9. The process as set forth in claim 8, in which said major pattern is transferred to said semiconductor layer through an ion-implantation, and said alignment pattern is transferred to said remaining part of said insulating substrate through an etching.

10. A process for fabricating a semiconductor device, comprising the steps of:
    preparing a substrate structure;
    forming a photo resist mask having a major pattern and an alignment pattern on said substrate structure;
    carrying out a pattern transfer from said photo resist mask to said substrate structure so as to concurrently form one of said major pattern and said alignment pattern in said substrate structure;
    carrying out another pattern transfer from said photo resist mask to said substrate structure so as to concurrently form the other of said major pattern and said alignment pattern in said substrate structure; and completing said semiconductor device through at least one photo-lithography process, wherein said step of preparing the substrate includes the sub-steps of preparing a preliminary structure and a jig having a body, receiving pins projectable from and retractable into said body and a frame capable of falling onto a peripheral area of said body, placing said preliminary structure on said receiving pins projecting from said body, retracting said receiving pins into said body so that said preliminary structure is mounted on said body, making said frame fall onto a peripheral area of said preliminary structure so that said peripheral area of said preliminary structure is covered with said frame, depositing a semiconductor on said frame and a central area of said preliminary structure, making said frame stand on said body, and removing said preliminary structure from said body so that said central area of said preliminary structure is converted with said semiconductor layer, whereby said substrate structure is obtained as said preliminary structure partially covered with said semiconductor layer.

11. The process as set forth in claim 10, in which said semiconductor is deposited through a plasma enhanced chemical vapor deposition.

12. The process as set forth in claim 11, in which said semiconductor is amorphous silicon.

13. A process for fabricating a semiconductor device, comprising the steps of:

preparing a substrate structure;

forming a photo resist mask having a major pattern and an alignment pattern on said substrate structure;

carrying out a pattern transfer from said photo resist mask to said substrate structure so as to concurrently form one of said major pattern and said alignment pattern in said substrate structure;

carrying out another pattern transfer from said photo resist mask to said substrate structure so as to concurrently form the other of said major pattern and said alignment pattern in said substrate structure; and completing said semiconductor device through at least one photo-lithography process, wherein said step of preparing the substrate includes the sub-steps of placing said preliminary structure on said pawls so that areas at corners of said preliminary structure are held in contact with said pawls;

depositing a semiconductor on the combination of said preliminary structure and said buffer plate so that said preliminary structure is covered with said semiconductor except for the areas held in contact with said pawls, and removing said preliminary structure from said buffer plate so that said substrate structure is obtained as said preliminary structure partially covered with said semiconductor.

14. The process as set forth in claim 13, in which said semiconductor is deposited through a low pressure chemical vapor deposition.

15. The process as set forth in claim 14, in which said semiconductor is amorphous silicon.

16. A process for fabricating a semiconductor device, comprising the steps of:

preparing a substrate structure;

forming a photo resist mask having a major pattern and an alignment pattern on said substrate structure;

carrying out a pattern transfer from said photo resist mask to said substract structure so as to concurrently form one of said major pattern and said alignment pattern in said substrate structure;

carrying out another pattern transfer from said photo resist mask to said substrate structure so as to concurrently form the other of said major pattern and said alignment pattern in said substract structure; and completing said semiconductor device through at least one photo-lithography process, wherein said step of preparing the substrate includes the sub-steps of preparing a preliminary structure and a frame, overlaying said preliminary structure with said frame so that a peripheral area of said preliminary structure is covered with said frame, depositing a semiconductor on said frame and said preliminary structure, and removing said frame from said preliminary structure so that said substrate structure is obtained as said preliminary structure partially covered with said semiconductor.

17. The process as set forth in claim 1, in which said step of completing the semiconductor device includes the sub-steps of forming another photo resist mask having another major pattern and another alignment pattern on said substrate structure, and concurrently transferring said another major pattern and said another alignment pattern to said substrate structure.

18. The process as set forth in claim 17, in which said another major pattern and said another alignment pattern are transferred to said resultant structure by using an etching.

19. The process as set forth in claim 1, in which said semiconductor device is a thin film transistor.

20. The process as set forth in claim 19, in which said major pattern defines channel regions of said thin film transistors.

* * * * *